(12) United States Patent
Cartier et al.

(10) Patent No.: US 8,492,247 B2
(45) Date of Patent: Jul. 23, 2013

(54) PROGRAMMABLE FETS USING VT-SHIFT EFFECT AND METHODS OF MANUFACTURE

(75) Inventors: Eduard A. Cartier, New York, NY (US); Qingqing Liang, Fishkill, NY (US); Yue Liang, Beacon, NY (US); Yanfeng Wang, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 185 days.

(21) Appl. No.: 12/858,094

(22) Filed: Aug. 17, 2010

(65) Prior Publication Data
US 2012/0043622 A1 Feb. 23, 2012

(51) Int. Cl.
*H01L 21/326* (2006.01)
(52) U.S. Cl.
USPC ........................................................ 438/466
(58) Field of Classification Search
USPC .......... 438/186, 216, 763, 592, 466; 257/265; 365/171
See application file for complete search history.

(56) References Cited

U.S. PATENT DOCUMENTS

| | | | |
|---|---|---|---|
| 6,210,999 B1 | 4/2001 | Gardner et al. | |
| 6,756,600 B2 | 6/2004 | Ng et al. | |
| 6,831,339 B2 * | 12/2004 | Bojarczuk et al. | 257/411 |
| 7,071,066 B2 | 7/2006 | Wang et al. | |
| 7,208,366 B2 | 4/2007 | Tsai | |
| 7,242,055 B2 * | 7/2007 | Bojarczuk et al. | 257/324 |
| 7,488,656 B2 | 2/2009 | Cartier et al. | |
| 7,498,271 B1 | 3/2009 | Donaton et al. | |
| 7,518,199 B2 | 4/2009 | Shimizu et al. | |
| 7,563,729 B2 | 7/2009 | Xiao et al. | |
| 7,858,500 B2 * | 12/2010 | Cartier et al. | 438/466 |
| 8,035,173 B2 * | 10/2011 | Bu et al. | 257/410 |
| 8,193,051 B2 * | 6/2012 | Bojarczuk et al. | 438/199 |
| 2003/0070305 A1 | 4/2003 | Oshika et al. | |
| 2003/0170939 A1 | 9/2003 | Yamazaki et al. | |
| 2004/0113171 A1 | 6/2004 | Chiu et al. | |
| 2005/0269635 A1 * | 12/2005 | Bojarczuk et al. | 257/338 |
| 2006/0046514 A1 | 3/2006 | Alshareef et al. | |
| 2007/0001244 A1 * | 1/2007 | Shimamoto et al. | 257/411 |
| 2008/0251852 A1 | 10/2008 | Arsovski | |
| 2009/0011610 A1 * | 1/2009 | Bojarczuk et al. | 438/763 |
| 2009/0302370 A1 * | 12/2009 | Guha et al. | 257/324 |
| 2010/0019358 A1 | 1/2010 | Cheng et al. | |
| 2010/0109068 A1 | 5/2010 | Bhattacharyya | |
| 2010/0148271 A1 | 6/2010 | Lin et al. | |
| 2010/0178772 A1 | 7/2010 | Lin et al. | |
| 2010/0295102 A1 * | 11/2010 | Sankin et al. | 257/265 |

OTHER PUBLICATIONS

International Search Report for App. No. PCT/US11/43855, mailing date Dec. 6, 2011.
Written Opinion of the International Searching Authority for App. No. PCT/US11/43855, mailing date Dec. 6, 2011.
Yoshiki, "Influences of Annealing Temperature . . . ZrO2 Gate Dielectrics", Journal of Applied Physics, 2006, Part 2, vol. 24, Issue 7, Abstract.

* cited by examiner

*Primary Examiner* — Nathan Ha
(74) *Attorney, Agent, or Firm* — Joseph Abate; Roberts Mlotkowski Safran & Cole, P.C.

(57) ABSTRACT

Programmable field effect transistors (FETs) are provided using high-k dielectric metal gate Vt shift effect and methods of manufacturing the same. The method of controlling Vt shift in a high-k dielectric metal gate structure includes applying a current to a gate contact of the high-k dielectric metal gate structure to raise a temperature of a metal forming a gate stack. The temperature is raised beyond a Vt shift temperature threshold for providing an on-state.

20 Claims, 5 Drawing Sheets

PROGRAMMABLE FETS USING VT-SHIFT EFFECT AND METHODS OF MANUFACTURE

FIELD OF THE INVENTION

The invention relates to semiconductor structures and methods of manufacture and, more particularly, to programmable field effect transistors (FETs) using high-k dielectric metal gate Vt shift effect and methods of manufacturing the same.

BACKGROUND

Negative Bias Temperature Instability (NBTI) is a key reliability issue that is of immediate concern in p-channel MOS devices operating with negative gate voltages. This same mechanism also affects nMOS transistors when biased in the accumulation regime, i.e., with a negative bias applied to the gate. NBTI manifests as an increase in the threshold voltage and consequent decrease in drain current and transconductance. The degradation exhibits log law dependence with time.

In sub-micrometer devices, nitrogen has been incorporated into the silicon gate oxide to reduce the gate current density and prevent boron penetration. However, incorporating nitrogen enhances NBTI. For this reason, in new technologies, e.g., 32 nm and shorter nominal channel lengths, high-k metal gate stacks, are used as an alternative to improve the gate current density for a given equivalent oxide thickness (EOT). Even with the introduction of new materials like Hafnium Oxides, NBTI still remains a concern. In addition, Hafnium Oxide based metal gates exhibit $V_t$ shift.

Vt-shift by oxygen-ingress is an issue causing Vt variation in high-k dielectric metal gate technology. It is believed that the Vt shift is due to two components: stable component and meta-stable component. The stable component refers to the removal of oxygen vacancies in $HfO_2$ and the meta-stable component refers to the formation of oxygen interstitials in $HfO_2$.

Accordingly, there exists a need in the art to overcome the deficiencies and limitations described hereinabove.

SUMMARY

In an aspect of the invention, a method of controlling Vt shift in a high-k dielectric metal gate structure comprises applying a current to a gate contact of the high-k dielectric metal gate structure to raise a temperature of a metal forming a gate stack. The temperature is raised beyond a temperature needed fro oxygen induced Vt shift on high-k materials.

In yet another aspect of the invention, a method of controlling Vt shift in a TiN metal gate structure with a hafnium based dielectric comprises raising a temperature of the TiN metal to above a Vt shift threshold by applying a current through contacts of the TiN metal gate structure.

In still yet another aspect of the invention, a structure comprises a metal gate structure comprising a Ti based metal formed on a hafnium based dielectric material and a poly material formed on the Ti based metal. The Ti based metal exhibits a Vt shift control effect due to a current induced temperature increase.

In yet a further aspect of the invention, a method in a computer-aided design system for generating a functional design model of a programmable field effect transistor (FET). The method comprises generating a functional representation of a metal gate structure comprising a Ti based metal formed on a hafnium based dielectric material and a poly material formed on the Ti based metal. The Ti based metal exhibits a Vt shift control effect due to a current induced temperature increase.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the programmable FET, which comprises the structures of the present invention. In still further embodiments, a method in a computer-aided design system is provided for generating a functional design model of the programmable FET. The method comprises generating a functional representation of the structural elements of the programmable FET.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to programmable field effect transistors (FETs) with high-k dielectric metal gate Vt shift effect and methods of manufacturing the same. Advantageously, the present invention provides a structure and fabrication methodology that uses a control effect to make programmable logic FET cells. In embodiments, the structure and fabrication methodology prevents Vt-shift by oxygen-ingress which causes Vt variation in high-k dielectric metal gate technologies.

In embodiments, the present invention controls Vt-shift by gate current heating. This methodology improves yield and cost of masks for different Vt shifts, is flexible for all circuit designs, and has memory applications (e.g., multi-valued memory like mirrorbit, or write-once memory). The methodology and resulting structure is compatible and easier (compared to known methodologies) to apply on the state-of-the-art CMOS SOI high-k dielectric metal gate technologies (e.g., high performance, high density). The present invention can be implemented in many different applications such as, for example, a field-programmable gate array (FPGA).

Figure 1:
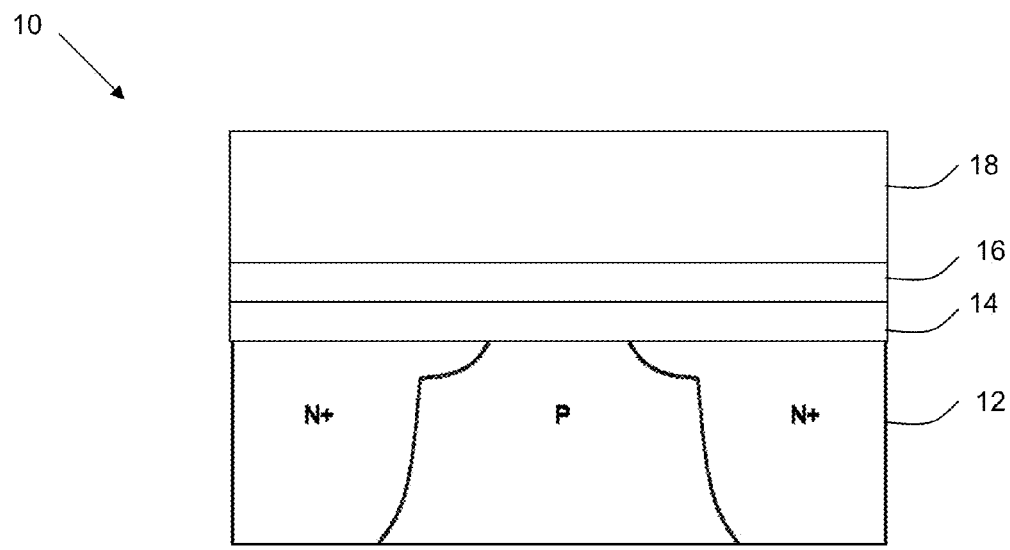
FIGS. 1-6 show structures and respective processing steps in accordance with aspects of the invention.

FIG. 1 shows a beginning structure and respective processing steps in accordance with aspects of the invention. In particular, the beginning structure 10 includes a substrate 12. The substrate 12 can be, for example, SOI, BULK, Si or other known substrates used in the fabrication of semiconductor devices. A dielectric 14 is formed on the substrate 12. In embodiments, the dielectric 14 is a high-k dielectric and can be, for example, a hafnium based material such as, hafnium dioxide ($HfO_2$); although other hafnium based dielectric materials are also contemplated by the present invention. For example, the high-k dielectric can be HFSIO, or a stack of combinations of such materials with or without oxide materials. The dielectric 14 can be deposited to a thickness of about 10 Å to about 20 Å; although other dimensions are contemplated by the present invention depending on design parameters and technology node. The dielectric 14 can be deposited using any well known deposition process such as, for example, chemical vapor deposition (CVD), ALCVD or PECVD.

A metal 16 is formed on the dielectric 14. The metal 16 can be one or more metal layers, depending on the particular design parameters. In embodiments, the metal 16 is Ti or TiN, which preferably responds well to the control effect of the present invention. In embodiments, the metal 16 can be deposited using conventional deposition methods as noted above, in addition to sputtering techniques. The metal 16 can be deposited to a thickness of about 20 Å to about 40 Å; although other dimensions are contemplated by the present invention depending on design parameters, technology node and preferences related to controlling the Vt shift using the methodologies described herein.

A poly layer 18 is deposited on the metal 16 using conventional deposition methods as noted above. In embodiments, the poly layer 18 can be deposited to a thickness of about 400 Å to about 500 Å; although other dimensions are contemplated by the present invention depending on design parameters and technology node.

Figure 2:
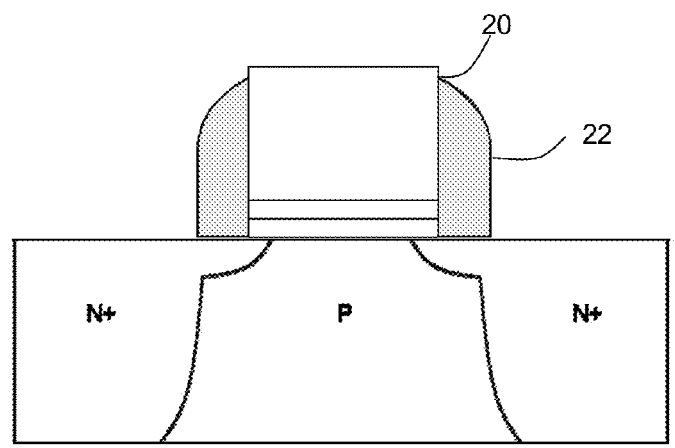

As shown in FIG. 2, the dielectric 14, metal 16 and poly layer 18 undergo a patterning process to form a metal gate stack 20. For example, using a conventional lithographic process, a resist can be deposited on the poly layer 18, masked and exposed to light to form a pattern. Once the exposed resist is washed away, a conventional reactive ion etching (RIE) can be used to form the metal gate stack 20. After an optional cleaning, a sidewall spacer 22 can be formed using conventional deposition processes, as noted above. In embodiments, the sidewall spacer 22 is a $SiO_2$; although other materials such as nitride can also be used as the sidewall spacer 22.

Figure 3:
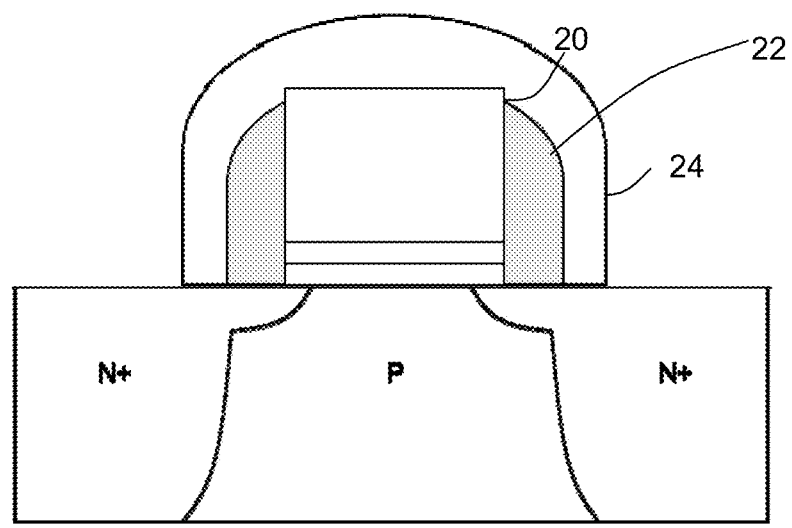

In FIG. 3, an optional layer 24 is deposited on the top of the metal gate stack 20 and the sidewall spacers 22. In embodiments, the optional layer 24 is SiN. The optional layer 24 can be deposited using the conventional deposition methods noted above.

Figure 4:
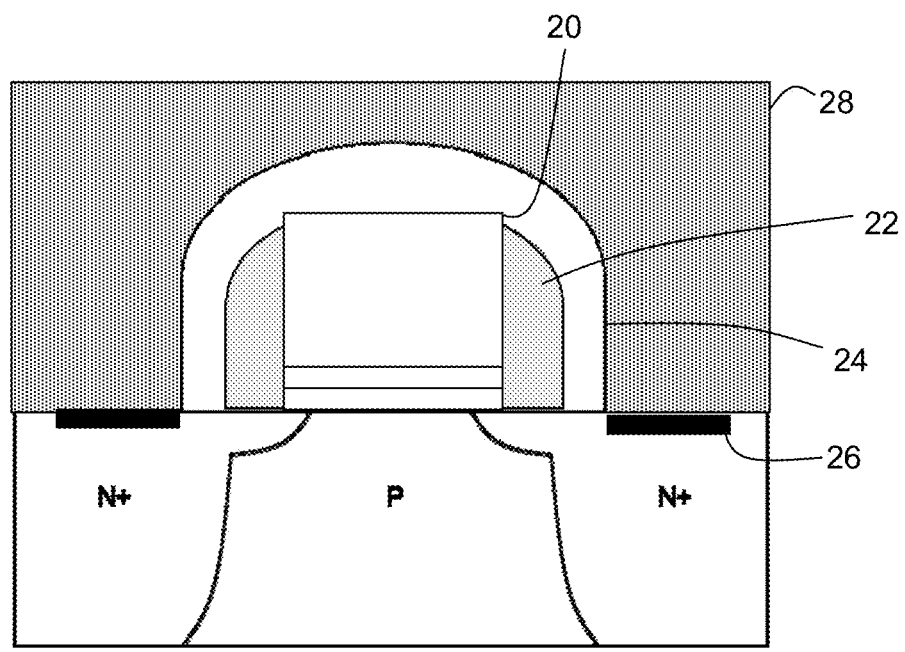

In FIG. 4, a metal is deposited on the sides of the optional layer 24 on the substrate 12. The metal is preferably a nickel layer which is then annealed to form nickel silicide contact regions 26. The annealing is performed at about 400° C., which is a temperature that will not melt the metal 16. The nickel silicide contact regions 26 will act as a contact region for source and drain regions. As should be understood by those of skill in the art, the metal can also be deposited on top of the metal gate stack 20 to form a contact region for the metal gate stack. (See, e.g., FIG. 7). After annealing, an insulator layer 28 is deposited on the structure. The insulator layer 28 may be, for example, a $SiO_2$; although other insulator materials are also contemplated by the present invention.

Figure 5:
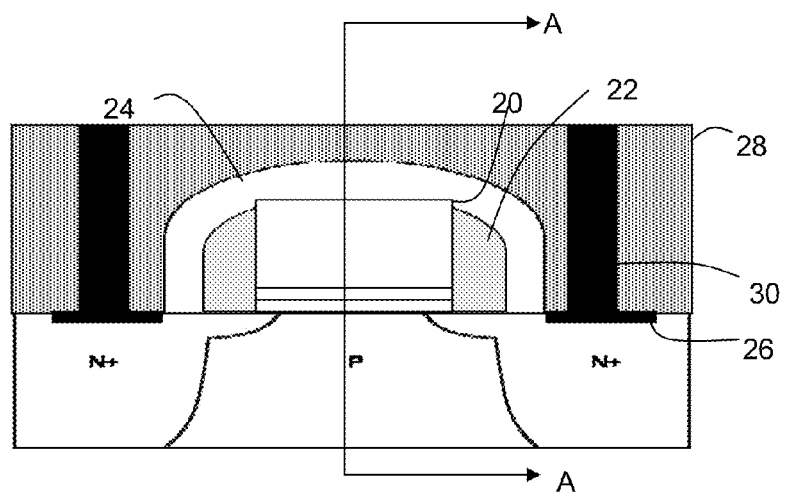
Figure 6:
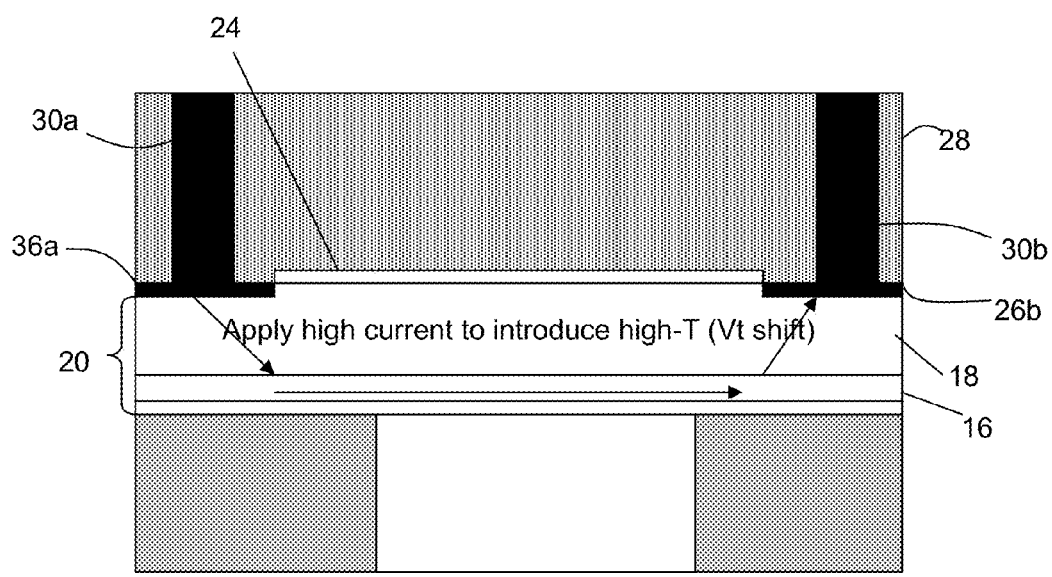

As shown in FIGS. 5 and 6, a wiring layer or contact 30 is formed in the insulator layer 28 to the silicide contact regions 26. In particular, a trench or via (opening) is opened in the insulator layer 30 to the silicide contact regions 26 on the source and drain regions and the metal gate stack using conventional lithographic fabrication processes. A metal is then deposited in the openings to form contacts or wirings 30 in electrical and direct contact with the silicide contact regions 26.

FIG. 6 is a cross sectional view along line A-A of FIG. 5, showing the contacts or wirings 30 directly and electrically contacting the silicide contact regions 26 of the metal gate stack 20. More specifically, as shown in FIG. 6, a current is applied through the contacts or wirings 30 directly and electrically contacting the silicide contact regions 26 of the metal gate stack 20. The current is passed through the poly layer 18 and into the metal layer 16, and back into the poly layer 18 and to the other of the contacts or wirings 30b of the metal gate stack 20. The high current introduces a high temperature and hence heats the metal 16 which, in turn, induces a Vt shift in the gate metal 16. In embodiments, 1.2 voltage can raise the temperature of the TiN metal 16 to about at least about 625° C. and preferably about 900° C. or greater, depending on the thickness and other dimensions of the metal gate material.

By way of illustration with regard to the structure described above, the thermal conductivity of the metal gate material (e.g., TiN) is about 40 W/(M·K). Assuming the TiN layer is 0.4 μm wide, 0.04 μm thick and 0.04 μm long, the thermal resistance of the TiN is about $6.25 \times 10^4$ K/W. Also, in this example, the power dissipation is about $1 \times 10^{-2}$ W. By utilizing the following equation (1), it becomes evident that by applying 1V across the TiN layer (with the electrical resistance of TiN being about 100 Ω), the temperature delta is about 625° C., which is much higher than the temperature needed for oxygen induced Vt shift on high-K materials.

$$R_{hs} = \frac{\Delta T}{P_{th}} - R_s \qquad (1)$$

where:
$R_{hs}$ is the thermal resistance of $Si/SiO_2$,
$P_{th}$ is the thermal power,
$R_s$ is the thermal resistance of the TiN, and
ΔT is the temperature difference.

Note that $Si/SiO_2$ thermal resistance is much smaller than TiN. Also, it should be understood by those of ordinary skill in the art that the dimensions of the TiN (metal 16) will affect the temperature rise and required applied voltage to provide the Vt shift in accordance with the present invention. However, in view of the description herein, one of skill in the art can easily determine the preferred dimensions of the TiN for the required Vt shift (without further explanation).

Figure 7:
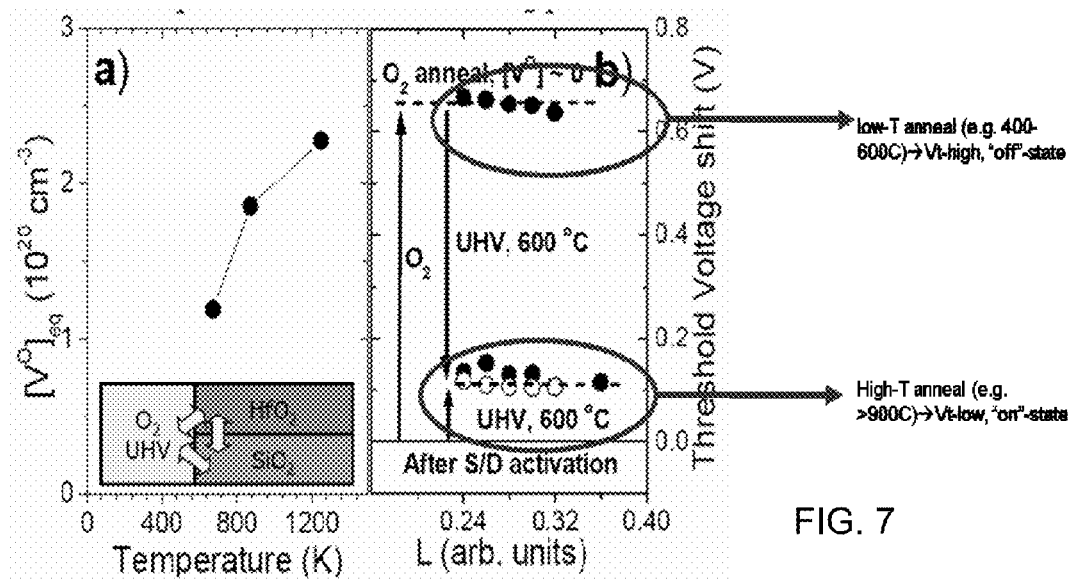
FIG. 7 shows a graph of threshold voltage shift (Vt shift) vs. temperature.

FIG. 7 shows a graph of threshold voltage shift (Vt shift) vs. temperature. In particular, the graph of FIG. 7 shows that a low temperature anneal of about 400° C. to about 600° C. will result in a Vt shift to high, e.g., an off state. With this temperature rise, the device will shut off an not conduct. However, a high temperature anneal of greater than 600° C. will begin shifting the Vt to low. As shown in FIG. 7, a temperature increase of about greater than 900° C. will result in Vt shift to low, e.g., an on state. With this temperature rise, the device will be "on" and conduct. Accordingly, by providing a current to the device as discussed with reference to FIG. 6, e.g., 1 voltage raises the temperature to about 900° C., it is possible to provide a Vt shift of the device to the "on" state.

Figure 8:
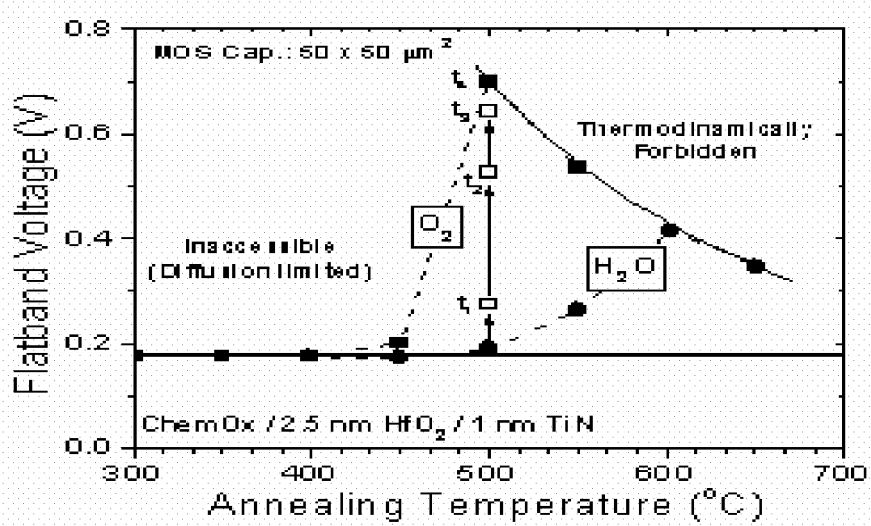
FIG. 8 shows flatband voltage vs. annealing temperature.

FIG. 8 shows flatband voltage vs. annealing temperature. In particular, FIG. 8 shows a programmable Vt shift by using a temperature increase in the device. Accordingly, it is possible by providing a current to the device as discussed with reference to FIG. 1, that the device can be Vt shifted. In this graphical representation, a large Vt shift begins to occur at about 500° C.

Figure 9:
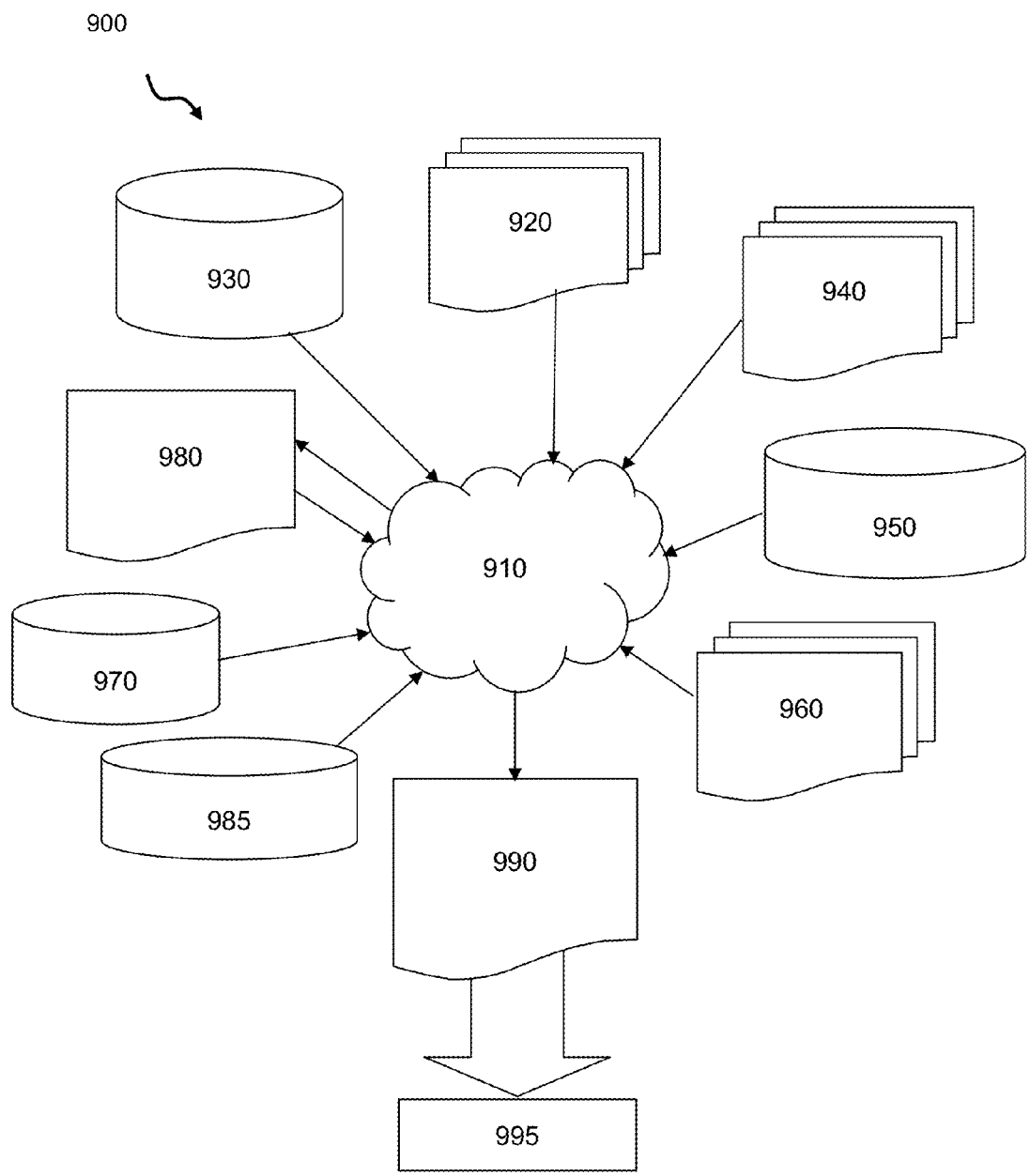
FIG. 9 is a flow diagram of a design process used in semiconductor design, manufacture, and/or test.

FIG. 9 is a flow diagram of a design process used in semiconductor design, manufacture, and/or test. FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-6. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-6. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-6 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-6. In one embodiment, design structure 990 may comprise a compiled, executable HDL simulation model that functionally simulates the devices shown in FIGS. 1-6.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-6. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method of controlling Vt shift in a high-k dielectric metal gate structure, comprising applying a current to a gate contact of the high-k dielectric metal gate structure to raise a temperature of a metal forming a gate stack, wherein the temperature is raised beyond a temperature needed for oxygen induced Vt shift on high-k materials.

2. The method of claim 1, further comprising providing 1V across the metal.

3. The method of claim 2, wherein the Vt shift temperature is about 625° C.

4. The method of claim 2, wherein the Vt shift temperature is about 900° C.

5. The method of claim 1, wherein a high-k dielectric of the high-k dielectric metal gate structure is a hafnium based material.

6. The method of claim 1, wherein the metal is TiN.

7. The method of claim 6, wherein the TiN is about 40 Å thick.

8. The method of claim 6, wherein the TiN is about 0.4 µm wide, 0.04 µm thick and 0.04 µm long.

9. The method of claim 8, wherein the TiN has a thermal resistance of about $6.25 \times 10^4$ K/W and a power dissipation of about $1 \times 10^{-2}$ W.

10. A method of controlling Vt shift in a TiN metal gate structure with a hafnium based dielectric, comprising raising a temperature of the TiN metal to above a Vt shift threshold by applying a current through contacts of the TiN metal gate structure.

11. The method of claim 10, wherein the temperature is raised to about 900° C. or greater.

12. The method of claim 10, wherein the temperature is raised to about 625° C.

13. The method of claim 10, wherein the TiN metal is about 40 Å thick.

14. The method of claim 10, wherein the TiN metal has a thermal resistance of about $6.25 \times 10^4$ K/W and a power dissipation of about $1 \times 10^{-2}$ W.

15. The method of claim 10, further comprising providing about 1.2 V across the TiN metal.

16. The method of claim 10, wherein the TiN metal is about 0.4 µm wide, 0.04 µm thick and 0.04 µm long.

17. A method in a computer-aided design system for generating a functional design model of a programmable field effect transistor (FET), the method comprising:

generating a functional representation of a metal gate structure comprising a Ti based metal formed on a hafnium based dielectric material and a poly material formed on the Ti based metal, wherein the Ti based metal exhibits a Vt shift control effect due to a current induced temperature increase.

18. The method of claim 17, wherein the functional design model comprises a netlist.

19. The method of claim 17, wherein the functional design model resides on storage medium as a data format used for the exchange of layout data of integrated circuits.

20. The method of claim 17, wherein the functional design model resides in a programmable gate array.

* * * * *